United States Patent [19]
Gimzewski et al.

[11] Patent Number: 4,668,865
[45] Date of Patent: May 26, 1987

[54] SCANNING TUNNELING MICROSCOPE

[75] Inventors: James K. Gimzewski, Zurich; Wolfgang D. Pohl, Adliswil, both of Switzerland

[73] Assignee: International Business Machines Corporation, Armonk, N.Y.

[21] Appl. No.: 836,274

[22] Filed: Mar. 5, 1986

[30] Foreign Application Priority Data

Mar. 7, 1985 [EP] European Pat. Off. ......... 85102554.4

[51] Int. Cl.⁴ .......................... G01N 23/00; G12B 1/00
[52] U.S. Cl. .................................. 250/306; 250/423 F
[58] Field of Search ............... 250/492.1, 492.2, 492.3, 250/306, 307, 398, 423 F

[56] References Cited

U.S. PATENT DOCUMENTS 4,203,128 5/1980 Guckel et al. .................... 357/60
4,343,993 8/1982 Binnig et al. .................... 250/306

FOREIGN PATENT DOCUMENTS 0071666 2/1983 European Pat. Off. .

OTHER PUBLICATIONS

Drake et al., "Tunneling Microscope for Operation in Air or Fluids," Rev. Sci. Instrum., 57(3), Mar. 1986.
Gerber et al., "Scanning Tunneling Microscope Combined With a Scanning Electron Microscope," Rev. Sci. Instrum. 57(2), Feb. 1986.
Angell et al., "Silicon Micromechanical Devices," Scientific American, vol. 248, No. 4, pp. 36-47 (Apr. 1983).

Primary Examiner—Bruce C. Anderson
Assistant Examiner—Paul A. Guss
Attorney, Agent, or Firm—Jackson E. Stanland

[57] ABSTRACT

An improved scanning tunneling microscope comprising a semiconductor chip into which slots are etched to form a central portion linked by a first pair of stripes to an intermediate portion, which in turn is linked by a second pair of stripes to the main body of the chip. The pairs of stripes have mutually orthogonal directions to allow the center portion to perform movements in the x- and y-directions under the control of electrostatic forces created between the stripes and their opposite walls. The center portion has formed into it at least one tongue carrying an integrated, protruding tunnel tip which is capable of being moved in the z-direction by means of electrostatic forces between said tongue and the bottom of a cavity below the tongue.

11 Claims, 14 Drawing Figures

SCANNING TUNNELING MICROSCOPE

DESCRIPTION

1. Field of the Invention

This invention relates to a scanning tunneling microscope of the type wherein a sharply pointed tip is maintained at a constant distance from a specimen to be investigated, and wherein the variations of the tunnel current occurring as the tip is raster-scanned across the surface of the specimen are employed to adjust said distance and to control a plotter or other recording device for generating an image of the specimen's topography.

2. Background of the Invention

Scanning tunneling microscopes of this sort are well known in the art, e.g. from U.S. Pat. No. 4,343,993. Such scanning tunneling microscopes (hereafter for convenience being abbreviated to STM) comprise a fine, electrically conducting tip, means for positioning a conductive specimen surface sufficiently close to said conductive tip so that a tunnel current flows, means for scanning said tip across the specimen's surface, means for automatically controlling the separation distance between said tip and the specimen surface while the tip is scanned across the surface in response to the measured tunnel effect, and means for graphically displaying the spatial coordinates of said scanning tip to produce a topological map of said surface.

For positioning the specimen with respect to the tip, several solutions have been proposed. One of these is described in European Patent Application EP-A1-0071666. A plate of piezoelectric material rests on three feet which may be selectively clamped to a bench surface by means of electrostatic forces. By appropriate application of potentials to the plate and by selectively clamping and releasing the feet, the specimen resting on said plate may be displaced in any direction.

While the travelling support of EP-A1-0071666 is useful for coarse positioning of the tip versus the specimen, fine positioning can be achieved with a known piezoelectric drive having three legs each associated with one coordinate and with the tunneling tip fixed at the joint of the three legs, cf. IBM Technical Disclosure Bulletin, Vol. 27, No. 10B, p. 5976 (1985).

For a tunnel current to flow, the distance between tip and specimen must be on the order of 1 nanometer. Of course, at such small distances, the surface roughness at the specimen tends to vary the separation between the tip and specimen which must be adjusted. The adjustment current is used to control a graphics display or recorder to which the coordinates of the current scanning position are also supplied.

With a tip having a radius of curvature of about 1 nm, and with scanning steps in the subnanometer range, a resolution of the surface of the specimen down to the atomic level can be achieved. As will be immediately apparent to those skilled in the art, the slightest vibration affecting the tunneling region will disturb the measurements. Vibration attenuation devices have already been described for use in connection with the STM, namely in European Patent Application EP-A1-0100785 and in IBM Technical Disclosure Bulletin, Vol. 27, No. 5, p. 3137 (1984).

DISCLOSURE OF THE INVENTION

As can be seen from a review of the state of the art as outlined above, the STM and all of its parts and aggregates are designed as rather bulky devices, i.e. they have large dimensions (several centimeters) and, hence, both a relatively large mass and relatively low stiffness (for example, a low bending stiffness proportional to the third power of the length), which results in a low resonance frequency. Since the vibrations occurring in any environment have a low frequency, it is desirable for vibration-sensitive apparatus to have a high resonance frequency. The best way of increasing the resonance frequency of a given design is to reduce its dimensions.

It is, therefore, an object of the present invention to provide a scanning tunneling microscope which is of small design and very stiff construction and which does not have the disadvantages of the prior art scanning tunneling microscopes, thus permitting even higher resolution.

Another important aspect is that because of their design, prior art scanning tunneling microscopes need high operating voltages which make them expensive to fabricate. They also require high-gain voltage amplifiers, which further adds to the cost. The STM of the present invention is easy and cheap to manufacture and operates at low voltages. As a result, it makes mass-production possible. The solution described herein is to design an STM which can be fabricated using silicon micromachining techniques, i.e. the essential parts of the STM are fabricated on a tiny silicon chip using micromechanical techniques which are per se known in the art.

An overview of the silicon micromachining art may be gained from J. B. Angell, S. C. Terry and P. W. Barth, "Silicon Micromechanical Devices," Scientific American, Vol. 248, No. 4, pp. 36–47 (April 1983). While silicon has become familiar as the material from which electronic circuits, and in particular integrated circuits, are fabricated, with widely publicized electrical properties, its mechanical properties, though highly interesting, have remained largely unnoticed.

The silicon employed in the electronics industry takes the form of single crystals which are grown from a melt and sliced into disk-shaped wafers from 0.2 to 0.5 mm thick. The homogeneous crystal structure of the material gives it the electrical properties needed in microelectronic circuits. Yet, silicon in this form also has desirable mechanical properties. Silicon has its position in the periodic system directly below carbon and forms the same type of crystal as diamond. Single-crystal silicon is brittle and can be cleaved like diamond, but it is harder than most metals; it is also extremely resistant to mechanical stress and has a higher elastic limit in both tension and compression than does steel. Even more importantly in connection with the STM of the present invention, single-crystal silicon remains strong under repeated cycles of tension and compression, whereas polycrystalline metals tend to weaken and break because the stresses accumulate at the intercrystal boundaries.

These and other properties combined with the tremendous expertise acquired in processing electronic components made of silicon make this material very well suited for the design of a scanning tunneling microscope.

Accordingly, the scanning tunneling microscope of the present invention comprises at least one electron-emitting tip maintained at an essentially constant distance shorter than about 2 nm from the surface of a specimen to be investigated, an xy-drive for scanning said tip in a matrix fashion across said surface, and means for displaying and/or recording the deviations in the tunnel current and/or the current required to maintain said distance essentially constant for generating an image of the specimen's surface, wherein said xy-drive consists of a semiconductor chip having a center portion connected by an intermediate portion and by two pairs of elastic stripes to the main body of said chip, said electron-emitting tip sitting on a tongue forming an integral part of said center portion and being capable of being moved in a z-direction normal to the plane of said chip.

This invention further relates to a method for manufacturing a scanning tunneling microscope of the type described above, comprising the steps of preparing a (110) oriented semiconductor chip, etching a four-sided portion at the center of said chip, which is linked by an intermediate portion and by two pairs of stripes to the main body of said chip, the slots between said stripes and said center portion and said intermediate portion respectively being made parallel to the (111) and (1-11) directions of the semiconductor material of said chip, rendering selected parts of the vertical walls of said chip, said portions and said stripes electrically conductive by doping said parts prior to etching and/or by depositing a metal layer thereon, underetching the area of said center portion of said chip supposed to carry said tip by using boron-doped layers, thus forming at least one tongue, growing a semiconductor platelet on said tongue, underetching said platelet to form said tip, and rendering said tip conductive by doping and/or coating with a film of conductive material.

BRIEF DESCRIPTION OF THE DRAWINGS

Details of embodiments of this invention will now be described, by way of example, with reference to the drawings in which:

FIG. 5 in steps (a) through (e) shows the manufacture of the semiconductor chip for the STM;

BEST MODE FOR CARRYING OUT THE INVENTION

Figure 1:
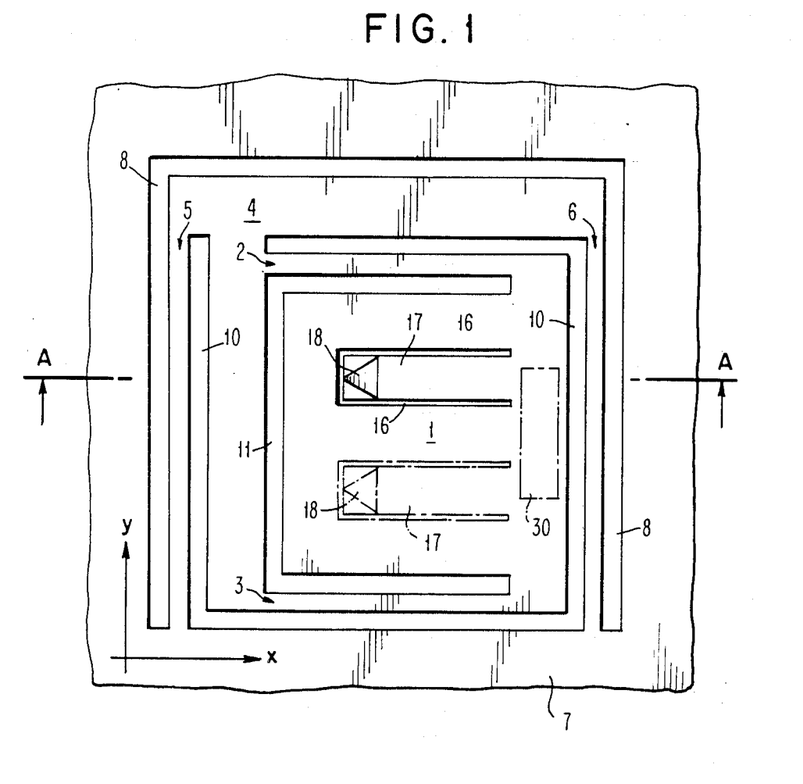
FIG. 1 is a top plan view of a semiconductor chip into which the scanning tunneling microscope of the present invention is formed.

The heart of a scanning tunneling microscope is the tunnelling tip with its xyz-drive, which provides a scan of the tip across the specimen and at the same time maintains the distance of the tip from the surface of the specimen within tight limits. FIG. 1 shows an embodiment of the scanning mechanism and distance control.

An essentially square portion 1 is linked by a first pair of stripes 2 and 3 to an L-shaped portion 4, and the latter in turn is linked by a second pair of stripes 5 and 6 to the body of a chip 7, which appears as if surrounding the combination of said square and L-shaped portions 1 and 4. In fact, the entire assembly comprising elements 1 through 7 is one piece, the slots between the elements having been created by etching.

Starting from a complete chip 7, a first horseshoe-shaped slot 8 and a second, smaller and oppositely oriented, rectangular slot 10 are etched through the entire thickness of chip 7 (which may be e.g. between 0.05 and 0.3 mm thick), leaving between slots 8 and 10 said parallel stripes 5 and 6. The stripes act as leaf springs permitting the structure encompassing elements 1 through 4 to oscillate in a direction orthogonal with respect to the length of the stripes. This direction is shown as the x-direction.

A third slot 11 extending inside slot 10 is etched between portions 1 and 4 so as to form another pair of stripes 2 and 3 permitting portion 1 to oscillate in a direction orthogonal with respect to the x-direction, which is shown as the y-direction. As a result of this, square portion 1 can be displaced in x and y directions with respect to chip 7. The positive x- and y-directions are assumed to point from the center area 4 towards stripes 2 and 6, respectively.

Figures 2, 3:
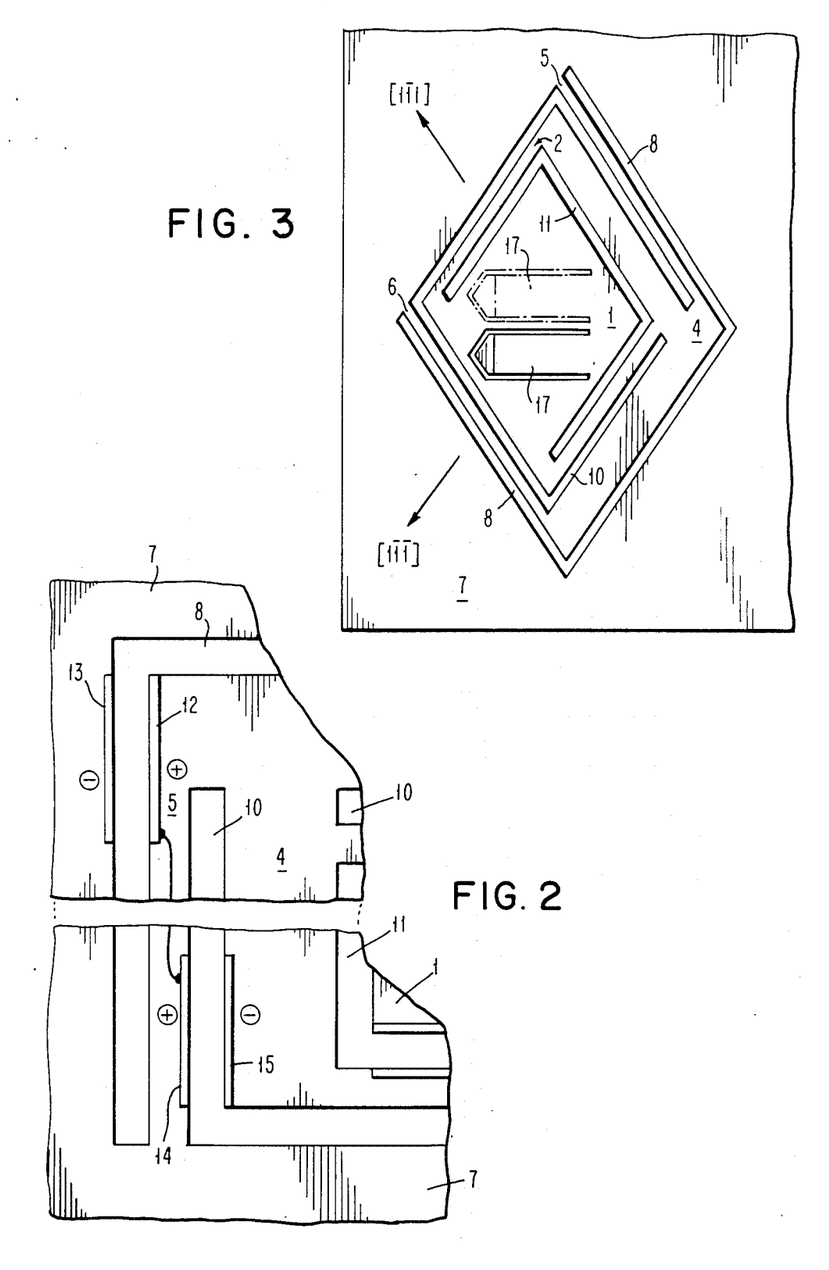
FIG. 2 is a detailed view of a portion of the xy-drive of the STM of FIG. 1.
FIG. 3 is a top plan view of an STM favorably aligned with regard to crystal orientation on a (110) semiconductor chip.

The driving force for the bending of stripes 2, 3 and 5, 6 is electrostatic attraction/repulsion. FIG. 2 shows how the potential is applied to stripe 5, for example, by means of electrodes 12 through 15, electrodes 12 and 14 being interconnected. A positive potential at electrodes 12, 14 and negative potential at electrodes 13 and 15, respectively, will cause attraction and thus move area 4 in the negative x-direction. Application of voltage across the respective electrode area at stripe 6 causes motion in the positive x-direction.

It is possible to achieve excursions of portion 1 in the x- and y-directions with respect to stationary chip 7 of sufficient amplitude for scanning purposes, using only modest voltages, by making the widths of stripes 2, 3, 5, 6 and slots 8 . . . 11 suitably small, which is easy to do with state of the art lithography and etching. For example, with a stripe length of 400 $\mu$m, and a slot width of 8 $\mu$m, and a stripe width of 8 $\mu$m, an excursion of $\pm 0.6$ $\mu$m can be achieved with only a potential of $\pm 50$ V. With an original chip thickness of 300 $\mu$m and a thinned-down center portion 1 of about 30 $\mu$m, the lowest resonance frequency of the structure of FIG. 1, which is mainly determined by the bending of the stripes 2, 3, 5, 6, can be kept above 4 kHz.

Essential in the implementation of the structure of FIG. 1 are, of course, the etching of the narrow stripes as well as rendering the sidewalls of slots 8 . . . 11 sufficiently conductive. One possibility is to use a (110) oriented silicon chip and make the slots parallel to the (111) and (1-11) directions of the single crystal silicon. This requires the replacement of the rectangular structure of FIG. 1 by a 70.5° parallelogram structure as shown in FIG. 3. The functioning of this structure is the same as that of the FIG. 1 device, but the advantage is that anisotropic etching may be used to create the required vertical walls in a simple and natural way.

Conductivity of the vertical walls of slots 8 . . . 11 can be achieved by doping the stripes and their opposing areas appropriately prior to etching. This may be advantageously done by thermomigration of liquid eutectic Al/Si alloy droplets through the single crystal silicon chip 7, as described in H. E. Cline and T. R. Anthony, "High-Speed Droplet Migration in Silicon," Jour. Appl. Phys., Vol. 47, p. 2325 (1976). Alternatively, a metal layer can be deposited on each of the sidewalls by electroplating or sputtering while the remainder of the chip is appropriately masked.

Figure 4:
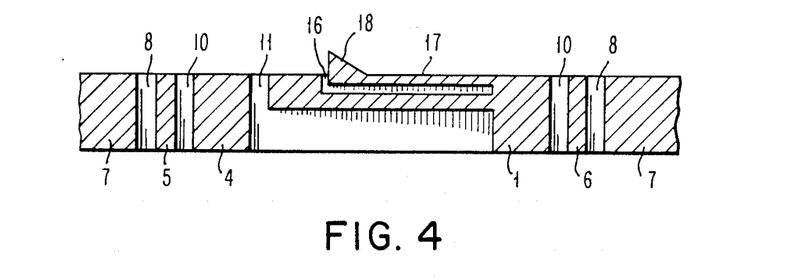
FIG. 4 is a cross-sectional view of the STM along line A—A in FIG. 1.

The tunnel tip in the embodiment of FIG. 1 is conceived as an integral part of portion 1 of chip 7. Cut into portion 1 by means of etching is a channel 16 drawn horseshoe-like in FIG. 1, which leaves a tongue 17 connected at one end to portion 1, as shown in FIG. 4, which is a cross-section through chip 7 of FIG. 1 along the line A—A. Tunnel tip 18 sits on the free end of tongue 17. Channel 16 extends all the way underneath tongue 17 to make tongue 17 a very thin membrane. Also, as mentioned before, portion 1 is reduced in thickness with respect to the remainder of chip 7 by a factor of 10. (Incidentally, none of the figures herein are drawn to scale.)

Figure 5A:
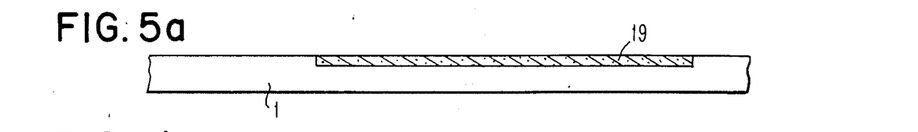
Figure 5B:
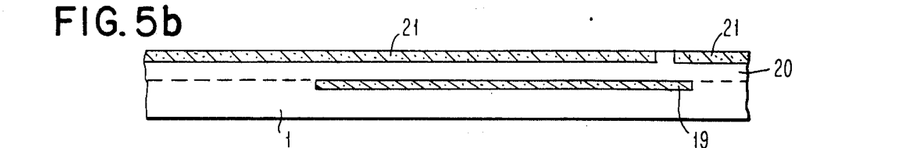
Figure 5C:
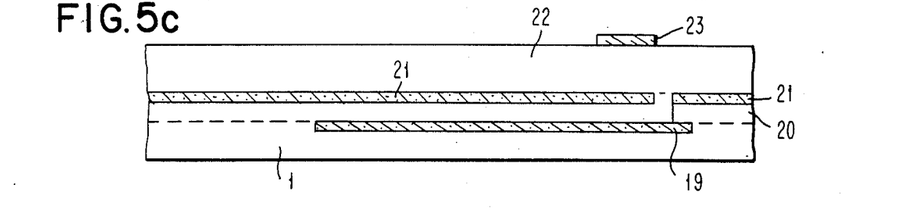
Figure 5D:
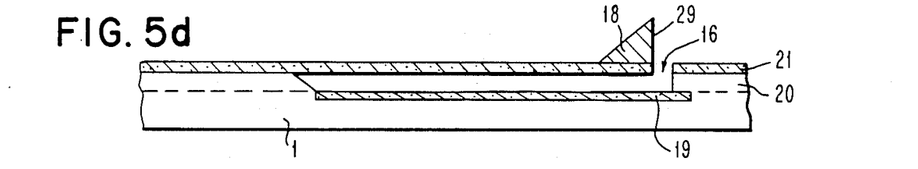
Figure 5E:
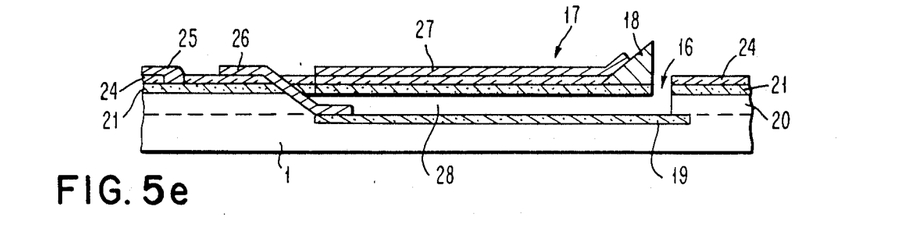

If chip 7 is assumed to consist of monocrystalline silicon, the necessary underetching for forming tongue 17 can be achieved by means of boron-doped layers. FIG. 5 shows an example of a possible set of processing steps. On top of the thinned center part of portion 1 consisting of n-type silicon a boron-doped layer 19 is created by diffusion (FIG. 5a). Layer 19 is then buried under a first epitaxially grown n-type silicon film 20 on top of which another boron-doped layer 21 is generated (FIG. 5b). Layer 21 in turn is buried under a second epitaxial layer 22. In the place where the tunnel tip 18 is later to be formed a $SiO_2$ platelet 23 is grown (FIG. 5c). Next the n-type silicon layer 22 is etched to open up channel 16 and cavity 28 around and underneath boron-doped layer 21, and to form tunnel tip 18 (FIG. 5d). Finally, an insulating $SiO_2$ layer 24 is formed on top of boron-doped layer 21 and provided with appropriate openings to permit deposition of metal contacts 25, 26 and 27, respectively contacting boron-doped layers 21 and 19 as well as tunnel tip 18 (FIG. 5e).

The thickness of the second epitaxial layer 22 and of the $SiO_2$ platelet 23 (FIG. 5c) must be chosen such that etching of tip 18 and of channel 16 as well as of cavity 28 below tongue 17 at least approximately take the same time. If that is not possible, tip 18 must be protected in an additional processing step. Tip 18 is the result of anisotropic etching. Its faces are oriented normal to the (111) and equivalent directions. Since chip 7 in the embodiment being described is assumed to be (110) oriented, two of these directions are in the chip plane (110) and the respective tip walls are vertical, cf. wall 29 in FIG. 5(d). As will be clear to those skilled in the art, tip 18 is formed after the $SiO_2$ platelet 23 is underetched completely.

Since tip 18 is the result of etching the high-resistivity intrinsic silicon layer 22, it must be rendered conductive for the purposes of the STM. It can either be doped or covered with a conducting film of a material different from silicon. If desired, microtips may be formed at the apex of tip 18 by electroadsorption known in the art, e.g. from the field ion microscopy. Obviously, a plurality of tongue 17/tip 18 arrangements can be manufactured side by side in portion 1 of chip 7 so as to easily permit a fresh tip to be substituted in place of a worndown used tip. If the spacing between two tips 18 is made very small, it is possible to obtain differential data by scanning the specimen with both tips at the same time.

In addition to the movement of tip 18 with respect to the specimen in x- and y-directions, tip 18 can be displaced in the z-direction by applying a potential to contacts 26 and 27, and across cavity 28. Since the boron-doped layers 19 and 21 are highly conductive, an electric field can be easily generated between those layers sufficient to bend tongue 17.

The dimensions of tongue 17 are determined by various parameters. Sufficient stiffness is needed to guarantee a high vibrational resonance frequency and a reasonable bending amplitude, which preferably should not exceed about 20% of the height of cavity 28 underneath tongue 17. Otherwise the electrostatic deflection of the tongue might become unstable.

For a contemplated deflection of 10 nm/V for tongue 17, and an assumed distance of 3 μm between tongue 17 and base 42 (FIG. 9), the dimensions given in the table below apply:

| Thickness t [μm] | 2 | 4 | 6 | 8 |
|---|---|---|---|---|
| Length L [μm] | 230 | 390 | 520 | 650 |
| $f_{Res}$ [kHz] | 54 | 38 | 31 | — |

A particular advantage of the present embodiment is the possibility of incorporating electronic circuitry on chip 7 using, for example, area 30 in FIG. 1 to implement a transistor which might transform the high-impedance tunnel system into a low-impedance noise-insensitive current source. The deflection of tongue 17 can be controlled with a resonant gate field-effect transistor as described in H. C. Nathanson, W. E. Newell, R. A. Wickstrom and J. R. Davis, Jr., "The Resonant Gate Transistor," IEEE Trans. on Electron Devices, Vol. ED-14, p. 117 (1967).

Figure 6:
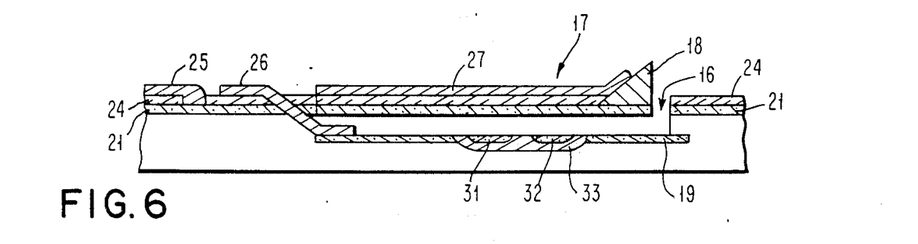
FIG. 6 shows the placement of a resonant gate transistor on the semiconductor chip of the STM.

FIG. 6 shows a resonant gate transistor with tongue 17 extending over the channel region of the MOS transistor. Source 31 and drain 32 of the transistor are embedded in a pad 33 for insulation from conductive layer 19. It will be clear to those skilled in the art that the manufacture of pad 33 as well as of source 31 and drain 32 will have to occur between the FIG. 5a and FIG. 5b steps. Tongue 17 serves as the gate electrode of the transistor. As a potential is applied between tongue 17 and layer 19 via their respective electrodes 27 and 26, tongue 17 is electrostatically attracted to bend towards layer 19, thereby effectively increasing the capacitance between tongue 17 and the channel region of the transistor. This change in capacitance results in a variation in the channel potential and a consequent alteration of the current through the transistor.

Figure 7:
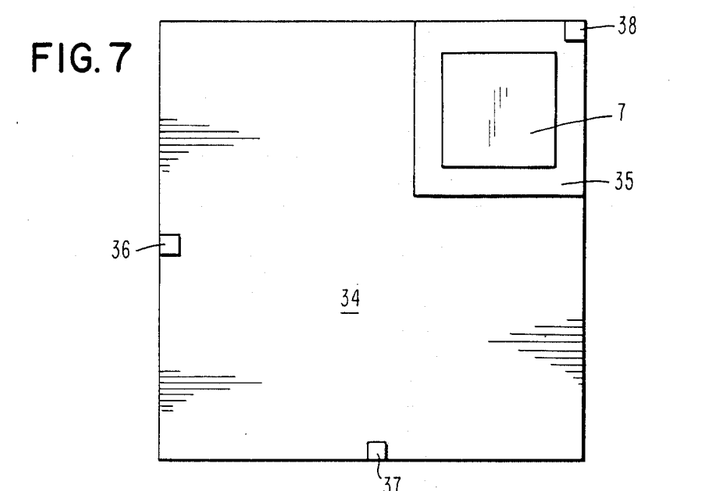
FIG. 7 shows the arrangement of the STM chip on a larger wafer.
Figure 8:
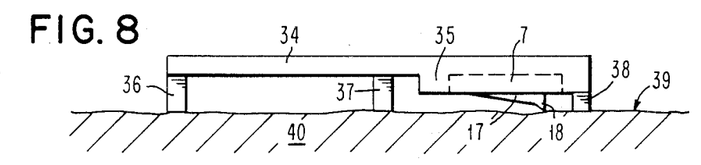
FIG. 8 is a side view of the wafer of FIG. 7.

FIG. 7 shows the integration of chip 7 in a wafer 34 which is for example shown to have a square outline. Chip 7 occupies one corner of wafer 34; it is surrounded by an area 35 which protrudes from the rest of wafer 34 as shown in the side view of FIG. 8. With its feet 36, 37, and 38, wafer 34 rests on the surface 39 of the specimen to be investigated. The height of foot 38 is adjusted so as to exceed that of tip 18 when tongue 17 is undeflected, by about 0.1 micrometer. Feet 36 and 37 are made to match the height of foot 38 with the allowance of large tolerances because of their large distance from tip 18.

To bring the STM into position, wafer 34 can simply be placed on the specimen, feet 36 through 38 will prevent any damaging of tip 18. However, since this is not a trivial step, particularly in a vacuum environment, the placement of the STM onto surface 39 of the specimen can be facilitated through use of the arrangement shown in FIG. 9.

Figure 9:
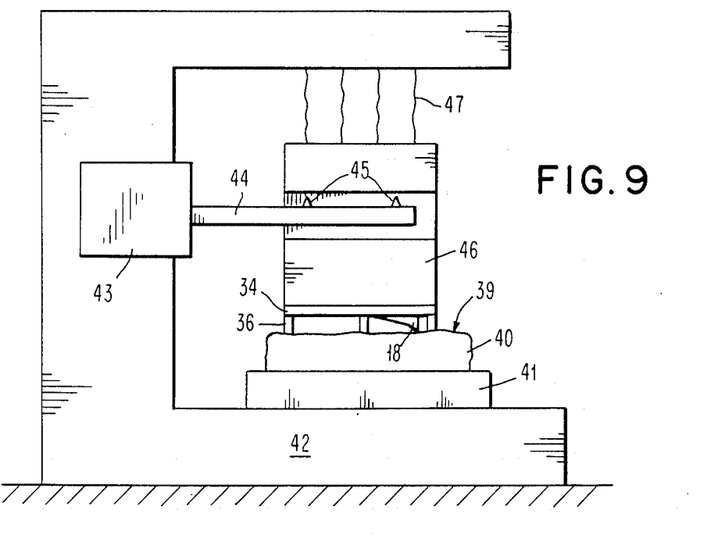
FIG. 9 shows the STM wafer combined with an xyz-drive module for coarse positioning.

The specimen 40 is mounted on a holder 41 which rests on a base 42. Also attached to base 42 is a conventional xyz-drive module 43 which can be actuated to move an arm 44 in the x- and y-directions as well as in the vertical z-direction. Hanging from arm 44 and supported on two rests 45 is a block 46 which carries chip 7 including tunnel tip 18 and its supporting structure. When block 46 is properly adjusted over specimen 40, xyz-drive module 43 will lower block 46 until the feet 36 . . . 38 touch the surface 39 of the specimen. Arm 44 can be lowered such that no physical contact between block 46 and arm 44 exists any longer, except for the electrical wires 47, which can be made very thin because of the small currents to be conducted. The number of wires required can be kept smaller than the number of functions performed by the STM if appropriate decoding is available on chip 7.

Figure 10:
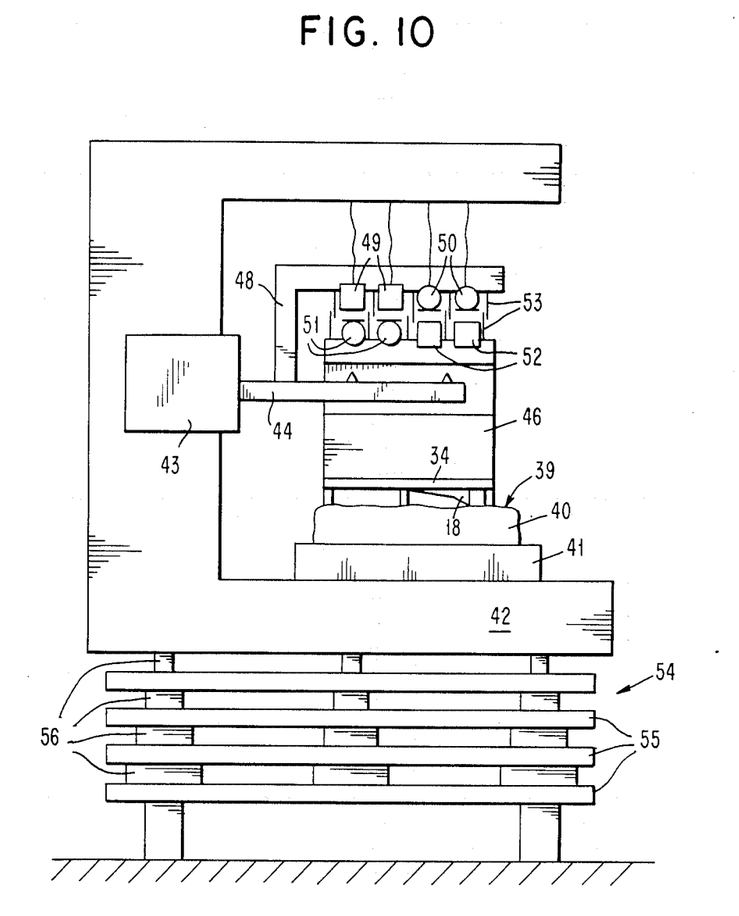
FIG. 10 shows the STM combined with optoelectronic signal transmission means and supported on a vibration filter.

In the embodiment shown in FIG. 10, the wires 47 are replaced by optoelectronic connections. Arm 44 carries a support 48 on which the required light emitting diodes 49 and photodetectors 50 are arranged. Their respective counterparts 51 and 52 are mounted on top of block 46. Fins 53 prevent cross-talk and provide cooling. In this embodiment, the optoelectronic bridge follows the motion of arm 44 and remains fixed after disconnection of arm 44 from block 46.

Still referring to FIG. 10, in operation, arm 44 positions block 46 over the specimen 40 by coarse selection of that part of the surface 39 thereof that is to be investigated, the positioning being controlled by xyz-drive module 43. A potential applied at contacts 25 and 26 (FIG. 5e) will cause an electric field between layers 19 and 21 and thus bend tongue 17 towards layer 19. When tip 18 has arrived over the selected surface area, arm 44 will lower, placing block 46 with its feet 36 through 38 on the surface 39 of specimen 40. With a potential applied between tip 18, via contact 27, and the surface 39 of specimen 40, a tunnel current will flow provided the distance between tip 18 and surface 39 is in the neighborhood of one nanometer. Reaching that distance is accomplished by slowly reducing the potential at contacts 25 and 26 so that tongue 17 is allowed to bend outwardly from layer 19.

To scan tip 18 across the surface 39 in a matrix fashion, appropriate potentials are applied at electrodes 12 through 15 (FIG. 2) controlling the positions of portions 1 and 4 in x- and y-directions with respect to the fixed part of chip 7. This scanning action, of course, occurs in a stepwise fashion such that each matrix point at which tip 18 is halted can be associated with a particular voltage required to maintain the tunnel current (and with it the distance between tip 18 and surface 39) at a predetermined value. Matrix position and value of adjustment voltage, if properly correlated, permit the generation of an image of the topography of the surface area scanned, as is well known in the art from U.S. Pat. No. 4,343,993 identified before.

As also shown in FIG. 10, the entire scanning tunneling microscope is arranged on top of a vibration filter 54 comprising a set of metal plates 55 separated by elastic pads 56, as described in IBM Technical Disclosure Bulletin, Vol. 27, No. 5, p. 3137.

Having thus described our invention, what we claim as new, and desire to secure by Letters Patent is:

1. A scanning tunneling microscope, comprising:
   at least one electron-emitting tip maintained at an essentially constant distance shorter than about 2 nm from the surface of a specimen to be investigated;
   an xy-drive for scanning said tip in a matrix fashion across said surface; and
   means for controlling and displaying and/or recording the deviations of the tunnel current and/or the current required to maintain said distance essentially constant for generating an image of the specimen's surface
   the improvement wherein said xy-drive comprises:
   a semiconductor chip having a main body, a center portion having an integral tongue, an intermediate portion and two pairs of elastic stripes,
   said center portion being connected by said intermediate portion and said two pairs of elastic stripes to said main body of said chip, and
   said electron-emitting tip being carried by said tongue and being capable of being moved in a z-direction normal to the plane of said chip.

2. A scanning tunneling microscope in accordance with claim 1, and comprising a plurality of electron-emitting tips, each of said electron-emitting tips being carried by a separate tongue and each of said tongues commonly forming an integral part of said center portion of said semiconductor chip.

3. A scanning tunneling microscope in accordance with claim 1, wherein said tongue is formed on said center portion of said chip over a cavity and wherein said tongue and the bottom of said cavity are electrically conductive and connected to individual electrodes to which a potential may be applied for moving said tongue vertically with respect to the bottom of said cavity by electrostatic forces.

4. A scanning tunneling microscope in accordance with claim 3, wherein said tongue is spaced from the bottom of said cavity by a distance which is at least five times the maximum bending deflection to which said tongue will be subjected.

5. A scanning tunneling microscope in accordance with claim 1, wherein said tip consists of high-resistivity intrinsic silicon which is made conductive by doping and/or coating with a film of conductive material other than silicon.

6. A scanning tunneling microscope in accordance with claim 5, wherein said tip comprises at least one electroadsorbed microtip at the apex thereof.

7. A scanning tunneling microscope in accordance with claim 1, wherein said semiconductor chip carries electronic circuitry for supplying current for tip to specimen separation control.

8. A scanning tunneling microscope in accordance with claim 1, and further comprising:
   a wafer on which said chip is mounted, said wafer having a plurality of feet for defining a distance between said tip and the surface of the specimen to be investigated; and
   a block upon which said wafer is mounted,
   an xyz-drive module having an arm, and
   said block being releasably connected to said arm for coarse positioning of said tip.

9. A scanning tunneling microscope in accordance with claim 8, and further comprising:
   a base for carrying said specimen; and
   a multi-stage vibration filter supporting said base without vibration,
   said xyz-drive module being mounted to said base.

10. A scanning tunneling microscope in accordance with claim 1, and further comprising:
   slots defining said stripes and having opposing walls; and
   opposing electrodes on said opposing walls of said slots for generating electrostatic forces for displacing said tip within the plane of said chip in x- and y-directions.

11. An improved scanning tunneling microscope of the type wherein an electron-emitting tip is maintained at an essentially constant distance shorter than about 2 nm from the surface of a specimen to be investigated, while an xy-drive scans said tip in a matrix fashion across said surface, the z-direction position of said tip or the tunnel current flowing between said tip and said surface being sensed and an image of the specimen's surface being generated therefrom, the improvement being an xy-drive for said scanning tunneling microscope, comprising:
   a semiconductor chip having a central body portion and elastic arms,
   said elastic arms suspending said central body portion for x-y movement in the plane of said chip; and
   electrodes for applying electrostatic force to said central body portion for moving said central body within the plane of said chip,
   said electron-emitting tip being carried by said central body.

* * * * *